(12) United States Patent
Schlupp et al.

(10) Patent No.: US 6,815,353 B2
(45) Date of Patent: Nov. 9, 2004

(54) MULTI-LAYER FILM STACK POLISH STOP

(75) Inventors: Ronald L. Schlupp, Los Gatos, CA (US); Linda Koyama, Los Altos, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/072,160

(22) Filed: Feb. 5, 2002

(65) Prior Publication Data

US 2003/0148609 A1 Aug. 7, 2003

(51) Int. Cl.[7] .............................................. H01L 21/302
(52) U.S. Cl. ....................... 438/691; 438/692; 438/693; 438/700; 438/737
(58) Field of Search ................................. 438/691, 692, 438/693, 700, 703, 737, 738, 424, 427, 428

(56) References Cited

U.S. PATENT DOCUMENTS

| | | | |
|---|---|---|---|
| 5,930,645 A | * | 7/1999 | Lyons et al. ................. 438/424 |
| 6,057,207 A | * | 5/2000 | Lin et al. .................... 438/424 |
| 6,194,305 B1 | * | 2/2001 | Iyer ........................... 438/622 |
| 6,194,784 B1 | * | 2/2001 | Parat et al. ................. 257/774 |

* cited by examiner

Primary Examiner—Lan Vinh
(74) Attorney, Agent, or Firm—Bever, Hoffman & Harms, LLP; James E. Parsons

(57) ABSTRACT

A method for improved dielectric polish control adjacent to device areas is described. This is particularly important for bipolar structures, although the method may be used for MOS structures as well. The method includes using highly selective methods for removing oxide layers and polish stop layers in a multi-layer film stack, providing an oxide edge step height that is substantially uniform regardless of the size of the adjacent device area. In one embodiment, the multi-film stack includes a first oxide layer, first nitride layer, second oxide layer, and second nitride layer. The multi-film stack is deposited on a substrate. Trenches are then etched through the multi-film stack and into corresponding regions of the substrate. A passivation oxidation layer is grown on the etched trench surfaces. The trenches are filled with oxide for isolating active device regions from one another. A first STI polish is performed, polishing the trench oxide to the level of the second nitride layer, which is then removed. The second oxide layer is then removed. A second STI polish is then performed, polishing the trench oxide to the level of the first nitride layer, which may then be removed. The oxide step height at the edge of each active device region is then approximately equal, regardless of the size of the device region, with a height approximately equal to the thickness of the first nitride layer.

42 Claims, 10 Drawing Sheets

MULTI-LAYER FILM STACK POLISH STOP

FIELD OF THE INVENTION

This invention relates to shallow trench isolation of semiconductor devices, and more particularly to a process for improved dielectric polish control in the fabrication of devices using shallow trench isolation.

BACKGROUND

Shallow trench isolation (STI) is a process used to isolate or separate active regions of devices in an integrated circuit from one another. STI may be used to isolate active device regions in MOS structures, as well as bipolar structures. A conventional STI process includes etching a trench between active device regions and filling the trench with a dielectric, usually silicon dioxide. Following deposition of the dielectric, an STI polish using a nitride polish stop layer is typically performed to remove oxide from the active device regions.

STI provides many advantages when fabricating bipolar devices. For example, STI can reduce peripheral junction capacitance with nearly planar junction breakdown and a nearly planar surface. However, one of the difficulties in using STI with bipolar devices is that the active device regions are small compared to the size of the trenches. These small active device regions may be over-polished during the extensive polishing that occurs during a conventional STI oxide polish step. Additionally, smaller active device regions are over-polished to a greater extent than larger active device regions, which leads to different oxide step heights at the edge of the active device regions. For example, the oxide step height at the edge of a smaller active device region may be as small as 0 angstroms (no step), while the oxide step height at the edge of a larger active device region may be as large as about 2000 angstroms.

This oxide step height variation can have negative effects on some semiconductor devices. For example, in a field oxide walled emitter NPN device, the variation in oxide step height may cause collector-to-emitter shorts by blocking the base implant, as well as $n^+$ polysilicon stringers along the oxide step for polysilicon emitter structures. The collector to emitter shorts are especially problematic when using very shallow base off-axis implants, which can be blocked entirely by the oxide wall edge.

A number of methods have been developed to minimize over-polishing the active device regions. Dummy active areas can be added to provide a larger polish stop area, but are not practical for dense layouts. Highly selective polishing methods have been used for the STI polish, in order to reduce the amount of overpolishing. However, highly selective polishing methods may not provide acceptable oxide step height uniformity. Pre-planarization techniques, which include resist planarization, dummy resist planarization, and reverse STI mask with isotropic or anisotropic etch, provide more uniform polishing. However, they require extra processing steps, increasing the cost and complexity of wafer processing. Furthermore, they are difficult to control, since they depend on the difference between the STI etch depth and oxide deposition thickness.

In resist planarization, a blanket layer of resist is spun-on to the surface over the oxide, forming a substantially planar surface. Since the surface is substantially planar, the resist is thinner over regions where the oxide layer is thicker; that is, the active device regions. The resist and oxide are then thinned by etching with nearly equal selectivities by plasma etching techniques. Dummy resist planarization uses the same method as resist planarization but also incorporates a resist mask as dummy active regions on the substrate to improve resist planarization. For reverse STI mask with wet or dry etch, a reverse mask is used to pattern the oxide, allowing the areas of the oxide over the active device regions to be subsequently etched using a wet or dry etch.

Each of these techniques reduces the non-planarity of the surface but is difficult to control. Therefore, a simple, less expensive, and more forgiving method of forming shallow-trench isolated bipolar structures, which minimizes over-polishing of small active device regions and provides for consistent oxide step height regardless of the size of the active device region, is desirable.

SUMMARY

The present invention provides improved dielectric polish control adjacent to device areas, compared to prior art STI processes. This is particularly important for bipolar structures, although the method may be used for MOS structures as well.

In an embodiment of the invention, dielectric polish control is improved by performing two STI polish steps using two polish stop layers rather than the single STI polish step and single polish stop layer of conventional processes. A trench isolation structure, for example, a shallow trench isolation structure, includes a multi-layer film stack on active device regions of a semiconductor substrate, where the multi-layer film stack includes at least two polish stop layers. Note that although the terms "trench isolation structure," "shallow trench isolation," and "STI" are used herein, in some embodiments devices are not electrically isolated from one another but rather are separated from one another. In an embodiment of the invention, the multi-film stack includes a second oxide layer deposited directly on the substrate, a second nitride polish stop layer deposited on the second oxide layer, a first oxide layer deposited on the second nitride polish stop layer, and a first nitride polish stop layer deposited on the first oxide layer.

The active device regions are separated by one or more trenches, which are etched through the multi-film stack and into corresponding underlying regions of the substrate. After the trenches are etched, a passivation thermal oxidation layer is grown on the etched surface. An oxide, which may be referred to as a trench oxide, is deposited to fill the trenches and to cover the top of the multi-film stack. The oxide serves to separate the active device regions of an integrated circuit from one another. Junctions that are shallower than the STI trench may be electrically isolated from one another by the trench oxide.

After the trench oxide is deposited, a first polish is performed. The first polish removes the trench oxide to the level of the first nitride polish stop layer. In an embodiment of the invention, the first polish is selective to nitride with respect to oxide. That is, the first polish removes oxide more readily than it removes nitride. According to an embodiment of the invention, the first polish is chemical mechanical polishing (CMP) using a highly selective cerium-based slurry.

The first nitride polish stop layer is removed after the first polish. In one embodiment, the first nitride polish stop layer is removed using a method that is selective to oxide with respect to nitride. That is, the method removes nitride more readily than it removes oxide. According to an embodiment of the invention, the first nitride polish stop layer is removed using a hot phosphoric acid etch, which is highly selective to oxide with respect to nitride.

A second polish is performed, which polishes the oxide to the level of the second nitride polish stop layer. The second polish is selective to nitride with respect to oxide. According to an embodiment of the invention, the second polish is chemical mechanical polishing (CMP) using a highly selective cerium-based slurry. The second nitride polish stop layer is removed after the second polish. In one embodiment, the second nitride polish stop layer is removed using a method that is selective to oxide with respect to nitride. For example, the second nitride polish stop layer may be removed using a hot phosphoric acid etch, which is highly selective to oxide with respect to nitride.

In an embodiment of the invention, a second oxide layer remains on the substrate after the second polish. Subsequent to the second polishing step, the oxide step height at the edge of the active device regions is approximately equal to the thickness of the second polish stop layer, regardless of the size of the active device region. The oxide step height for an active device region is the difference in height between the top of the trench oxide at the edge of an active device region and the top of the second oxide layer on the active region near the edge of the active device region.

A more complete understanding of embodiments of the present invention will be afforded to those skilled in the art, as well as a realization of additional advantages thereof, by a consideration of the following detailed description of one or more embodiments. Reference will be made to the appended drawing that will first be described briefly.

BRIEF DESCRIPTION OF THE DRAWING

Use of the same or similar reference numbers in different figures indicates the same or like elements.

DETAILED DESCRIPTION

To eliminate the problem of over-polishing active device regions, a multi-film stack including two or more polish stop layers replaces the conventional single nitride polish stop layer. Additionally, a second STI polish step is performed. The second STI polish is much less extensive than the first; it merely thins and tapers the oxide into the active device regions. Therefore, the second STI polish does not cause the over-polishing that accompanies the first STI polish. After the second STI polish, the oxide step height for all active device regions is about equal to the thickness of the polish stop layer used for the second STI polish, regardless of active device island size.

Figure 1:
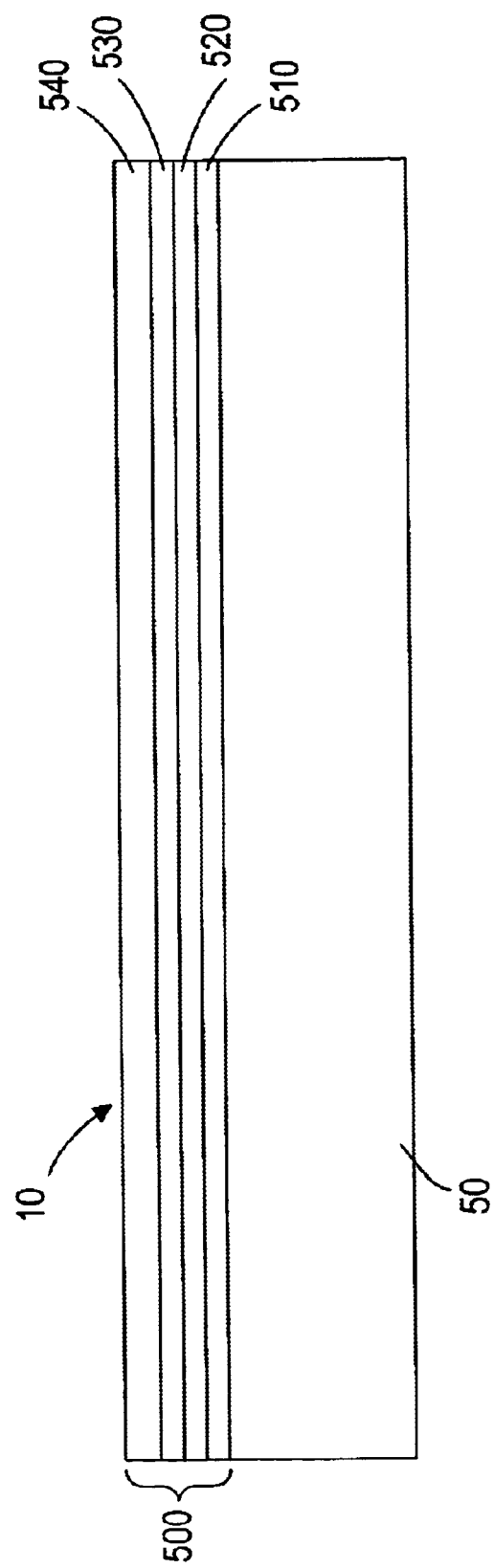
FIG. 1 shows a multi-layer film stack deposited on a substrate according to one embodiment.

FIGS. 1 through 10 show an embodiment of the current invention. In FIG. 1, the device areas are stripped of all films down to silicon, and a multi-film stack 500 is formed on a substrate 50 of a wafer 10. For example, an oxide layer 510 is first deposited on substrate 50. Oxide layer 510 is approximately 100 angstroms thick silicon dioxide deposited using a silane ($SiH_4$) PECVD process, by TEOS PECVD, LPCVD LTO (low temperature oxide), or by thermal oxide methods. Other thicknesses for oxide layer 510 may be used; for example, thicknesses between about 100 angstroms and about 200 angstroms.

A polish stop layer for the second STI polish, nitride layer 520, is deposited on oxide layer 510. Nitride layer 520 is approximately 500 angstroms thick $Si_3N_4$, deposited by PECVD methods. Alternately, a low-pressure chemical vapor deposition (LPCVD) process may be used. PECVD methods may provide better selectivity for STI polishing. Other thicknesses for nitride layer 520 may be used; for example, thicknesses between about 300 angstroms and about 700 angstroms.

An oxide layer 530 is deposited on nitride layer 520. Oxide layer 530 is approximately 200 angstroms thick, deposited by PECVD methods. Alternately, oxide layer 530 may be deposited by LTO methods. Other thicknesses for oxide layer 530 may be used; for example, thicknesses between about 100 angstroms and about 400 angstroms.

A nitride polish stop layer for the first STI polish, nitride layer 540, is deposited on oxide layer 530. Nitride layer 540 is approximately 2000 angstroms thick $Si_3N_4$, deposited by PECVD or LPCVD methods. Other thicknesses for nitride layer 540 may be used; for example, thicknesses between about 1000 angstroms and about 2500 angstroms.

The optimum thicknesses and useful thickness ranges of layers 510, 520, 530, and 540 are a function of the polish uniformity and selectivity. For example, when the first STI polish is performed using a highly selective polishing slurry, the thickness of nitride layer 540 may be reduced, while for a less selective slurry the thickness of nitride layer 540 may need to be increased.

Figure 2:
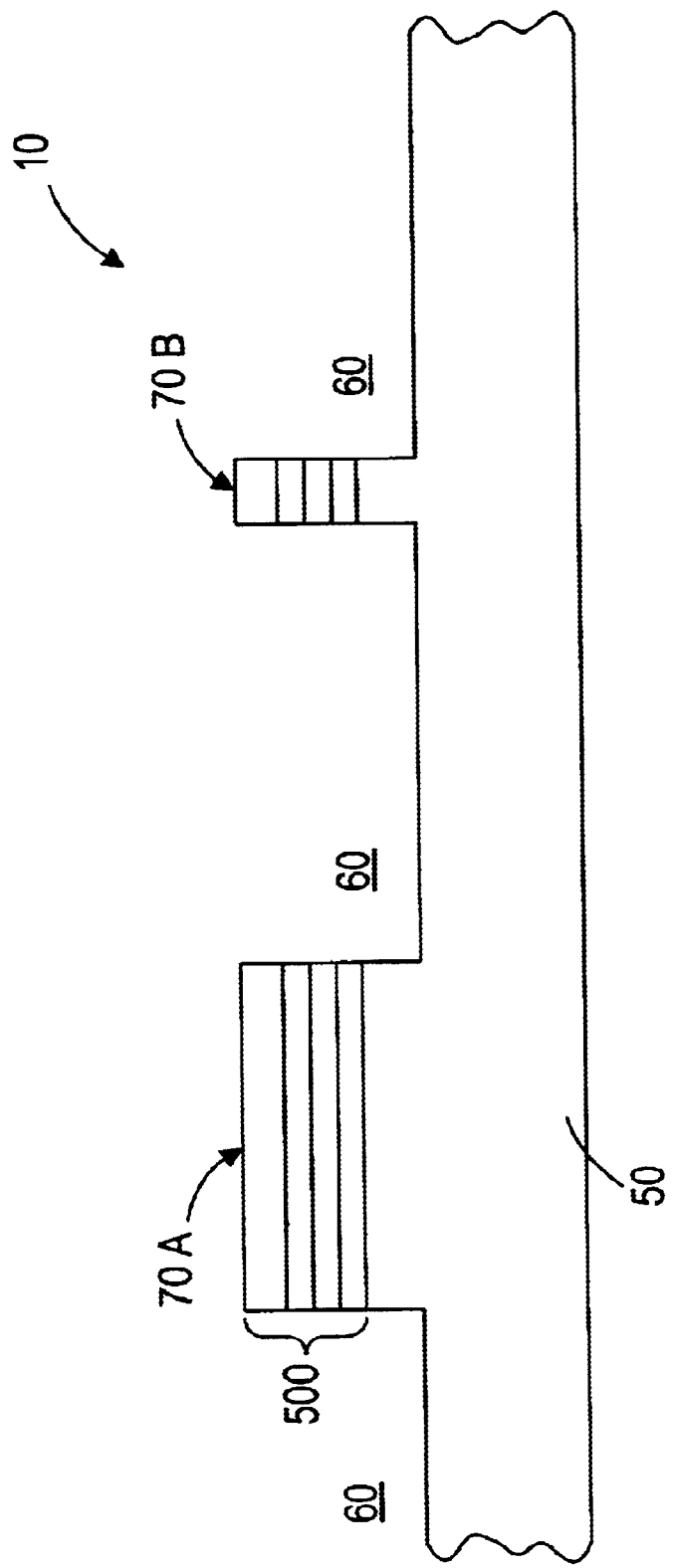
FIG. 2 illustrates an STI trench etch on the stack of FIG. 1, where the film stack remains on the active device areas.

In FIG. 2, after multi-film stack 500 deposited, it is patterned using an STI resist mask (not shown). Trenches 60 and active device island regions 70A and 70B are formed by etching, using conventional techniques.

Figure 3:
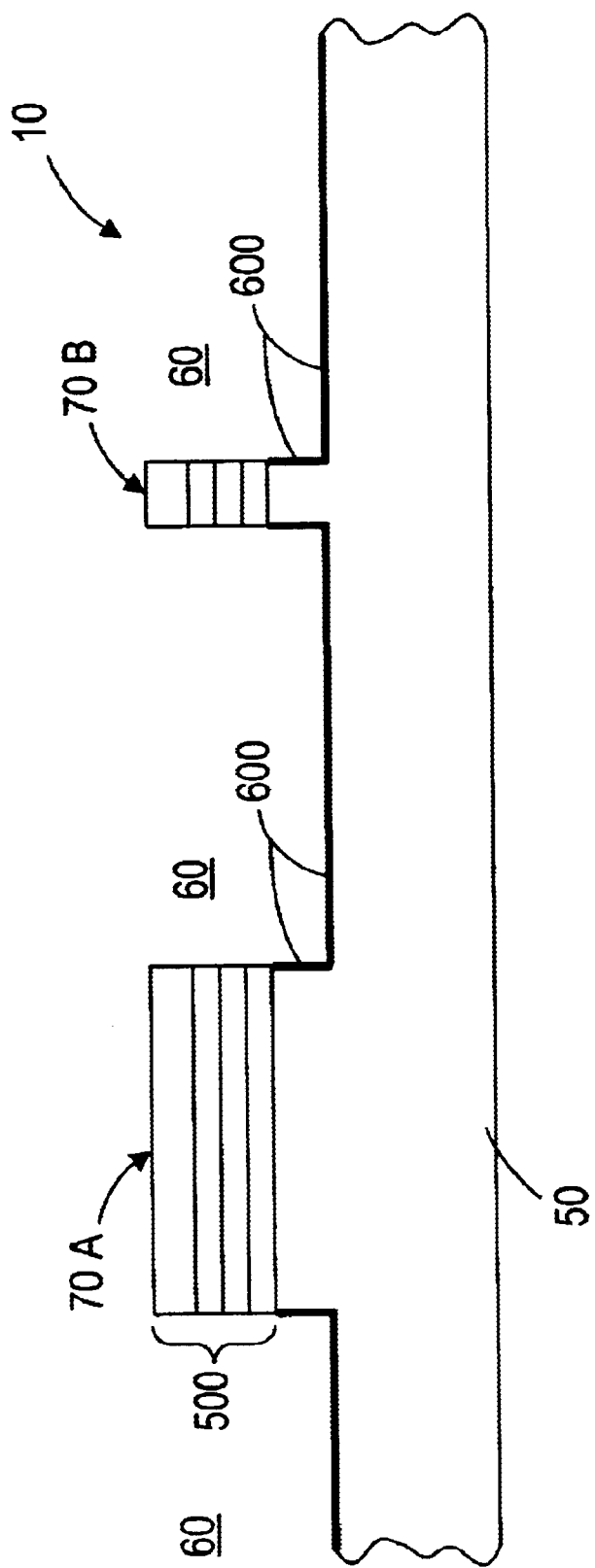
FIG. 3 illustrates performing the side-wall passivation oxidation on the structure of FIG. 2.

In FIG. 3, after the STI etch, a side wall passivation oxide layer 600 is grown, using conventional thermal oxidation methods.

Figure 4:
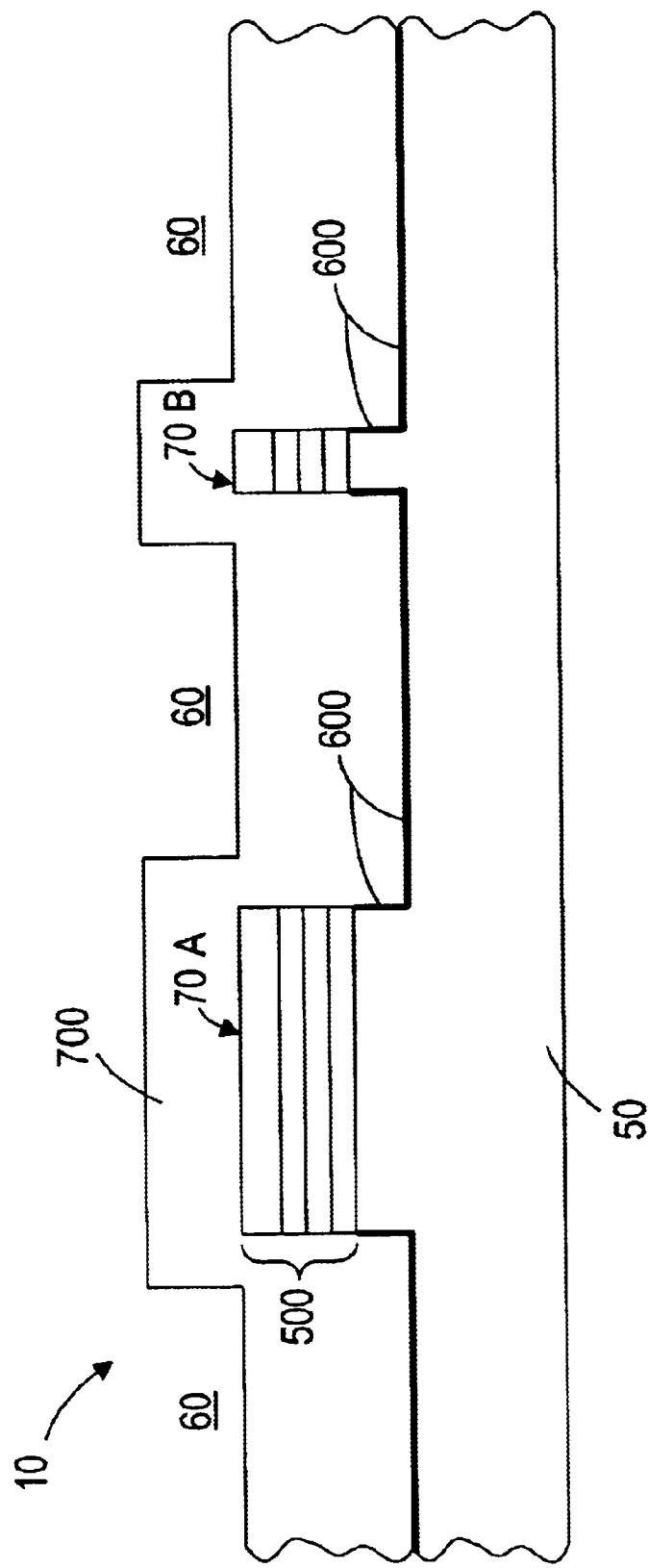
FIG. 4 shows a profile of the trench and active device areas after field oxide deposition on the structure of FIG. 3.

As shown in FIG. 4, a trench oxide, such as field oxide 700, is deposited after the side-wall passivation process, according to well-known methods. For example, field oxide 700 may be deposited using a TEOS (tetraethylorthosilicate; $Si(OC_2H_5)_4$) PECVD (plasma-enhanced CVD) process or a HDP (high density plasma) PECVD process. Field oxide 700 is deposited to substantially fill trenches 60. The thickness of field oxide 700 is at least equal to the trench depth plus the thickness of the multi-layer film stack; it is typically about 9000 angstroms thick. In some embodiments, field oxide 700 is densified by heating wafer 10, according to well-known methods. Densification may increase etching uniformity of field oxide 700, reducing fast etching of sidewalls. Further, pre-planarization using conventional techniques may be performed after deposition of field oxide 700 to remove some of the oxide above active device regions 70A and 70B. However, pre-planarization is not necessary.

Figure 5:
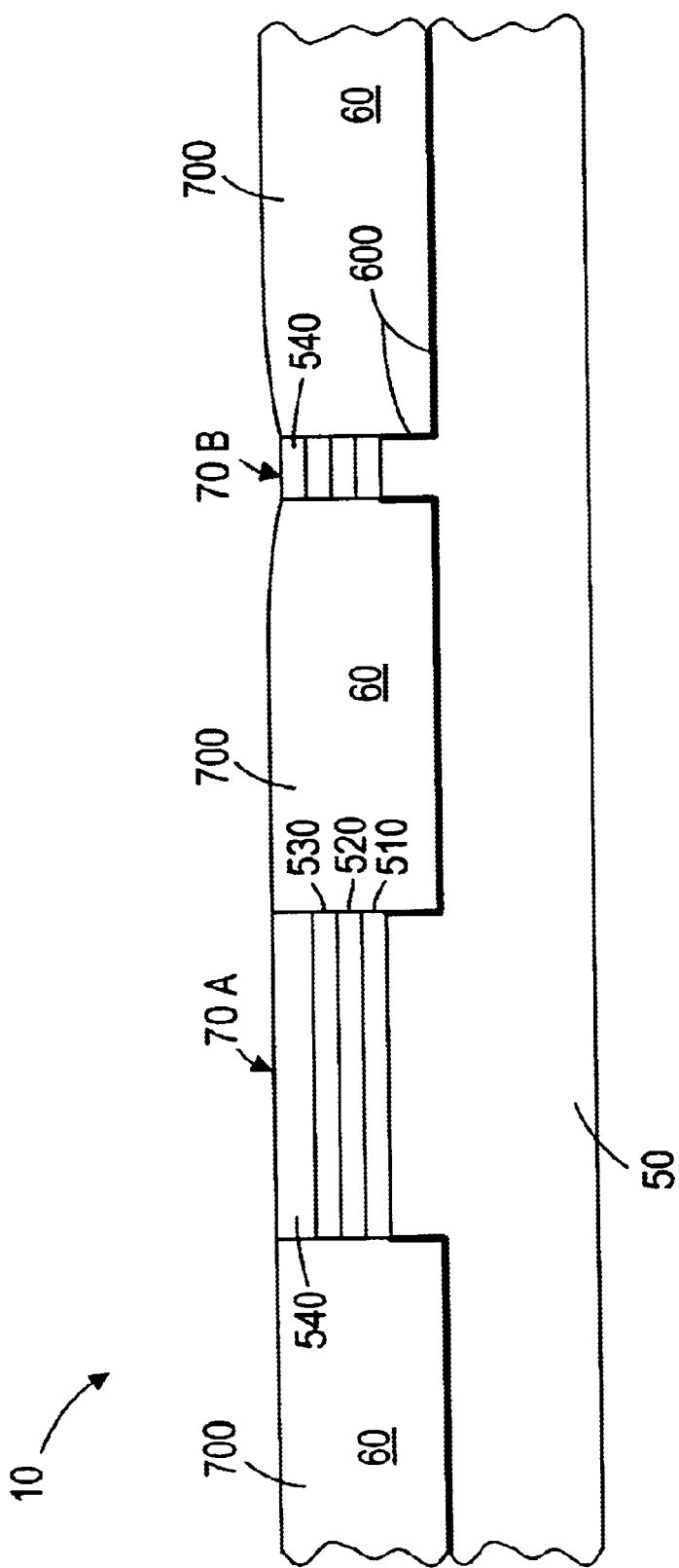
FIG. 5 illustrates the first STI polish step on the structure of FIG. 4.

FIG. 5 shows the structure after the first STI polish has been performed. The first STI polish is CMP, using a slurry that is selective to nitride with respect to oxide. For example, a cerium-based slurry may be used, which provides a selectivity of about 50 to 1, as measured with a blanket wafer. Using a slurry that is selective to nitride with respect to oxide allows the first polish step to substantially planarize field oxide 700 without excessive removal of nitride layer 540 over active device island regions 70A and 70B and thus allows a larger range of active device island sizes.

The first STI polish needs to remove a significant amount of oxide from above active device regions 70A and 70B. Like a conventional STI polish, the first STI polish may overpolish active device regions 70A and 70B, with smaller active device region 70B overpolished to a greater extent than larger active device region 70A. FIG. 5 shows that about half of nitride layer 540 of smaller active device region 70B has been removed by the first STI polish, while nitride layer 540 of larger active device region 70A is essentially unchanged. As a result, the thickness of trench oxide 700 between active device regions 70A and 70B is non-uniform.

Figure 6:
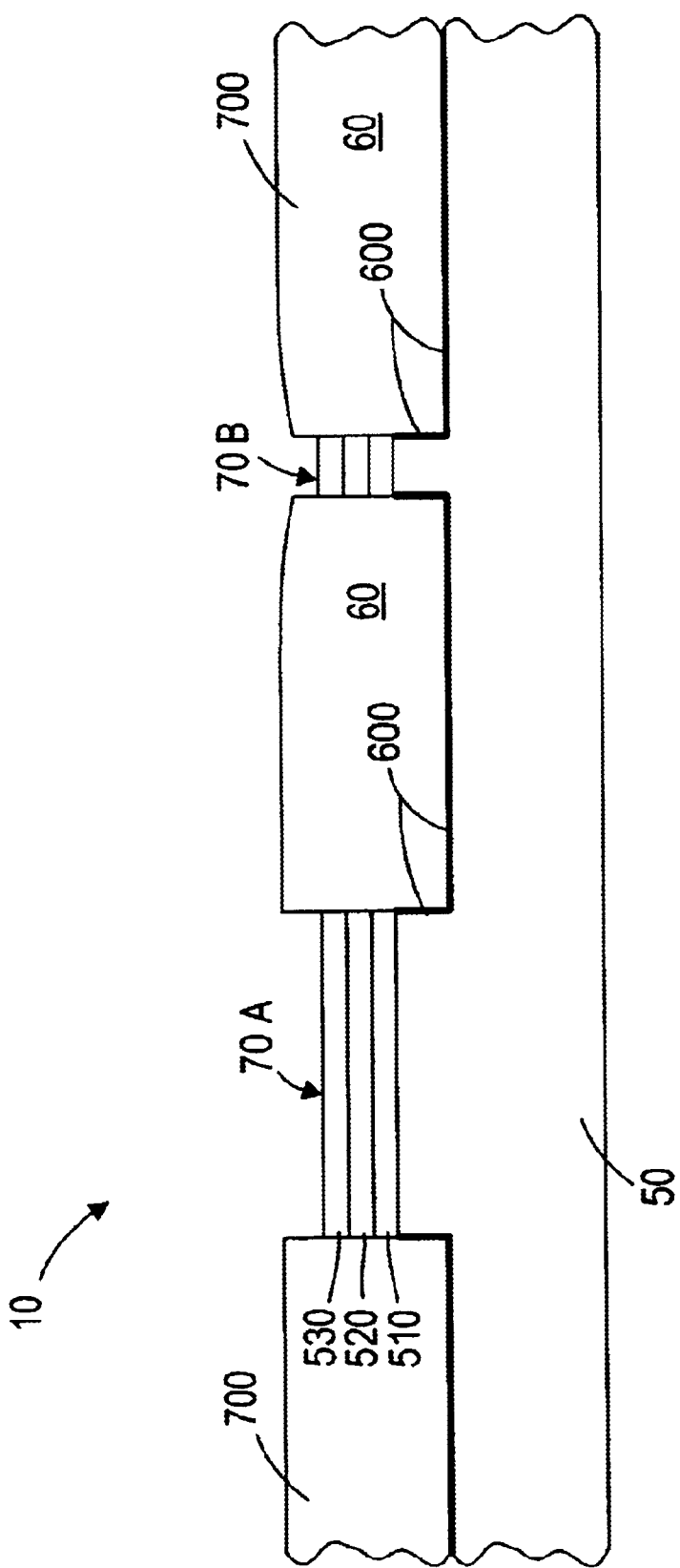
FIG. 6 shows the structure after the second nitride layer has been removed from the structure of FIG. 5.

FIG. 6 shows the structure after nitride layer 540 has been removed. Nitride layer 540 may be removed with an etch selective to oxide with respect to nitride, for example a hot phosphoric acid etch, using oxide layer 530 as an etch barrier.

Figure 7:
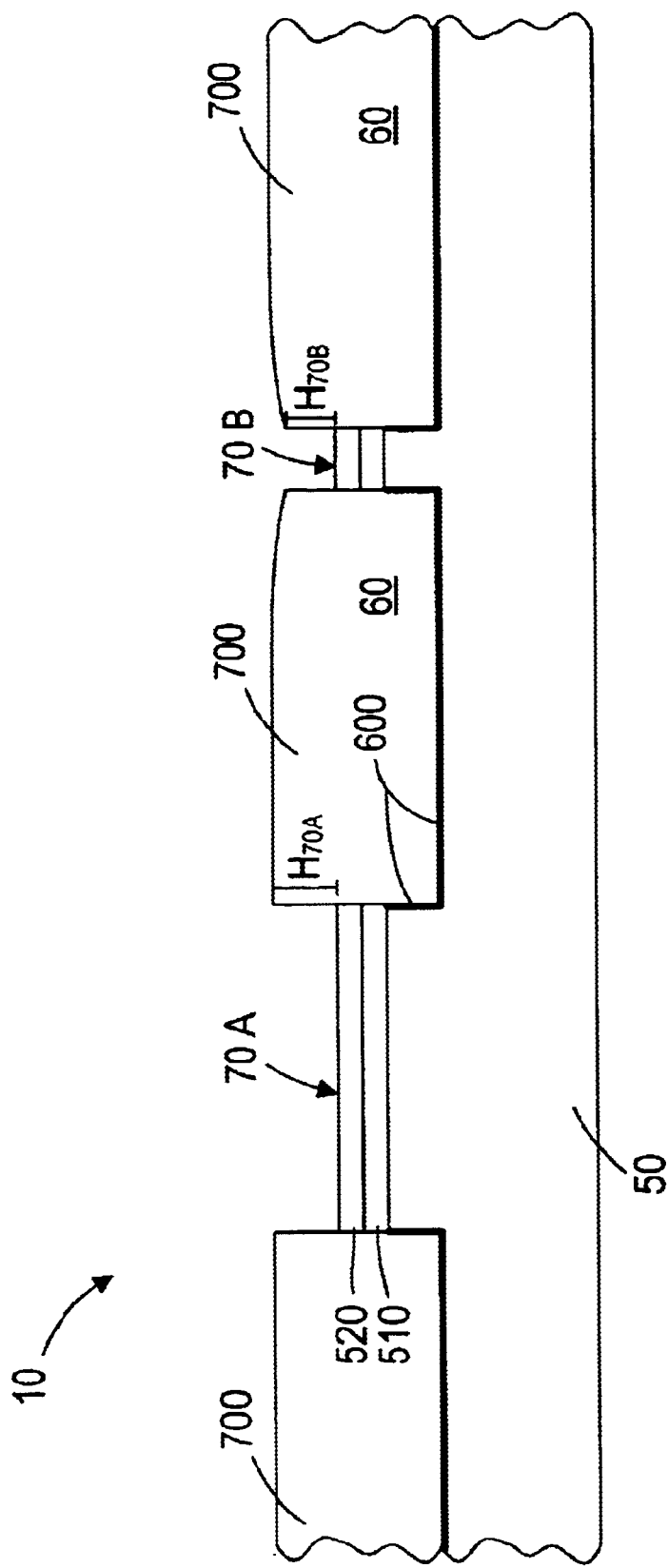
FIG. 7 shows the structure after the second oxide layer has been removed from the structure of FIG. 6.

FIG. 7 shows the structure after oxide layer 530 has been removed. Oxide layer 530 may be removed by wet oxide etching or reactive ion etching (RIE). RIE provides more uniform etch rates between sidewall and horizontal deposited oxides than wet oxide etching. FIG. 7 illustrates the problem encountered with a single STI polish step and a single polish stop layer. In the example shown here, the first STI polish removed more of nitride layer 540 over smaller active device island region 70B than over larger active device island region 70A. After removal of nitride layer 540 and oxide layer 530, the oxide step height at the edge of larger device island region 70A, $H_{70A}$, is greater than the oxide step height at the edge of smaller device island region 70B, $H_{70B}$. In order to eliminate the problem, a second STI polish with a second polish stop layer is performed.

Figure 8:
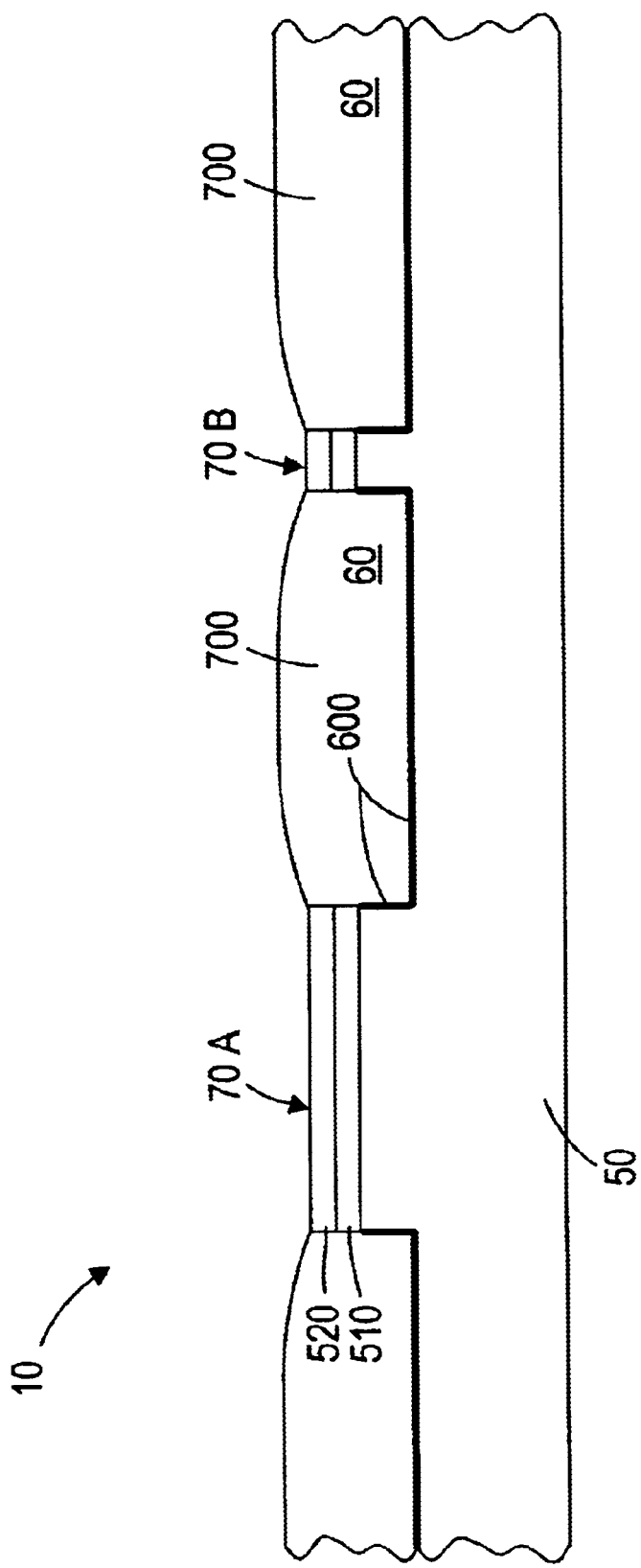
FIG. 8 illustrates the structure after the final STI polish step on the structure of FIG. 7.

FIG. 8 shows the structure after the second STI polish, selective to nitride with respect to oxide, is performed. The second STI polish is performed by CMP, using a highly selective cerium-based slurry. This polish thins and tapers field oxide 700 into the active device island regions 70A and 70B down to the level of nitride layer 520. Since the second STI polish primarily polishes the oxide edges along the active device island regions 70A and 70B, there is much less sensitivity to island size than in the first polish, where the polishing removed a significant amount of oxide. Thus, minimal nitride is polished from nitride layer 520 in active device island regions 70A and 70B during the second STI polish.

Figure 9:
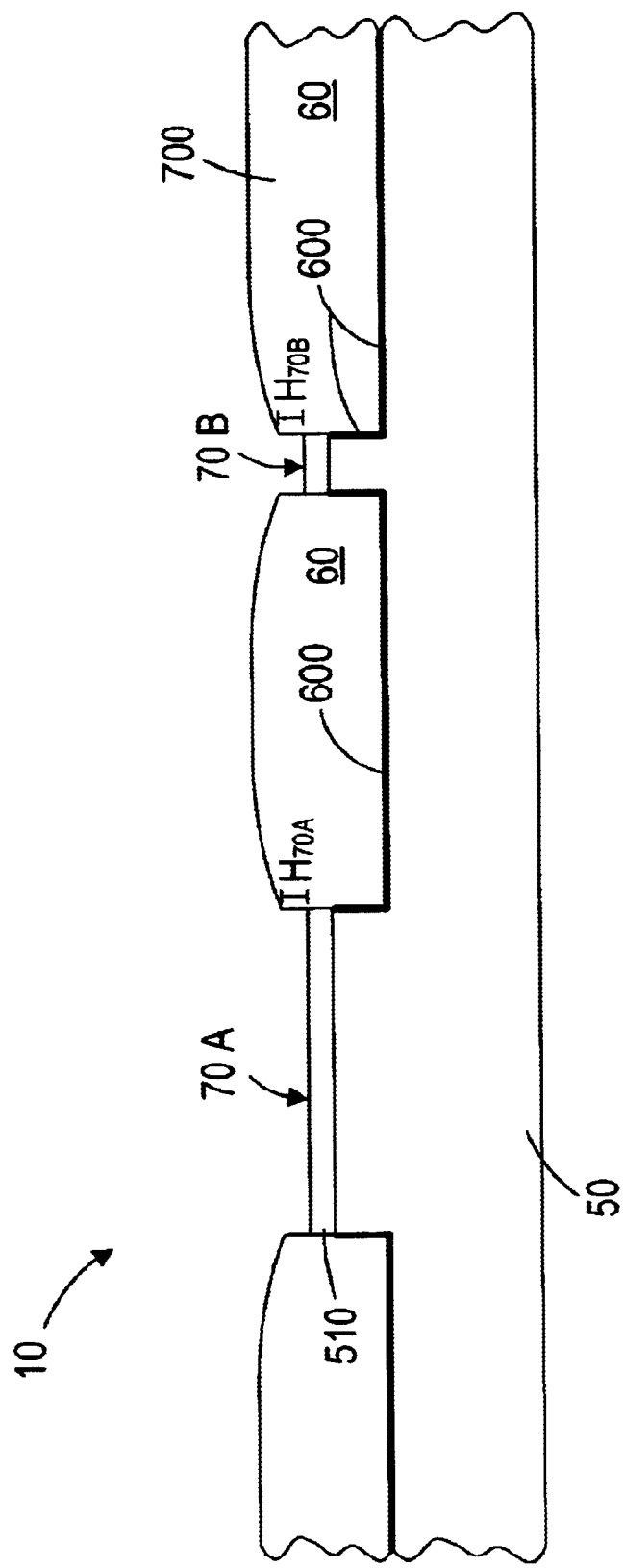
FIG. 9 shows the structure after the first nitride layer has been removed from the structure of FIG. 8.

FIG. 9 shows the structure after nitride layer 520 has been removed with an etch selective to oxide with respect to nitride; for example, a hot phosphoric acid etch. After nitride layer 520 has been removed, the oxide step height at the edge of larger device island region 70A, $H_{70A}$, is approximately equal to the oxide step height at the edge of smaller device island region 70B, $H_{70B}$. Both are approximately equal to the thickness of nitride layer 520.

Figure 10:
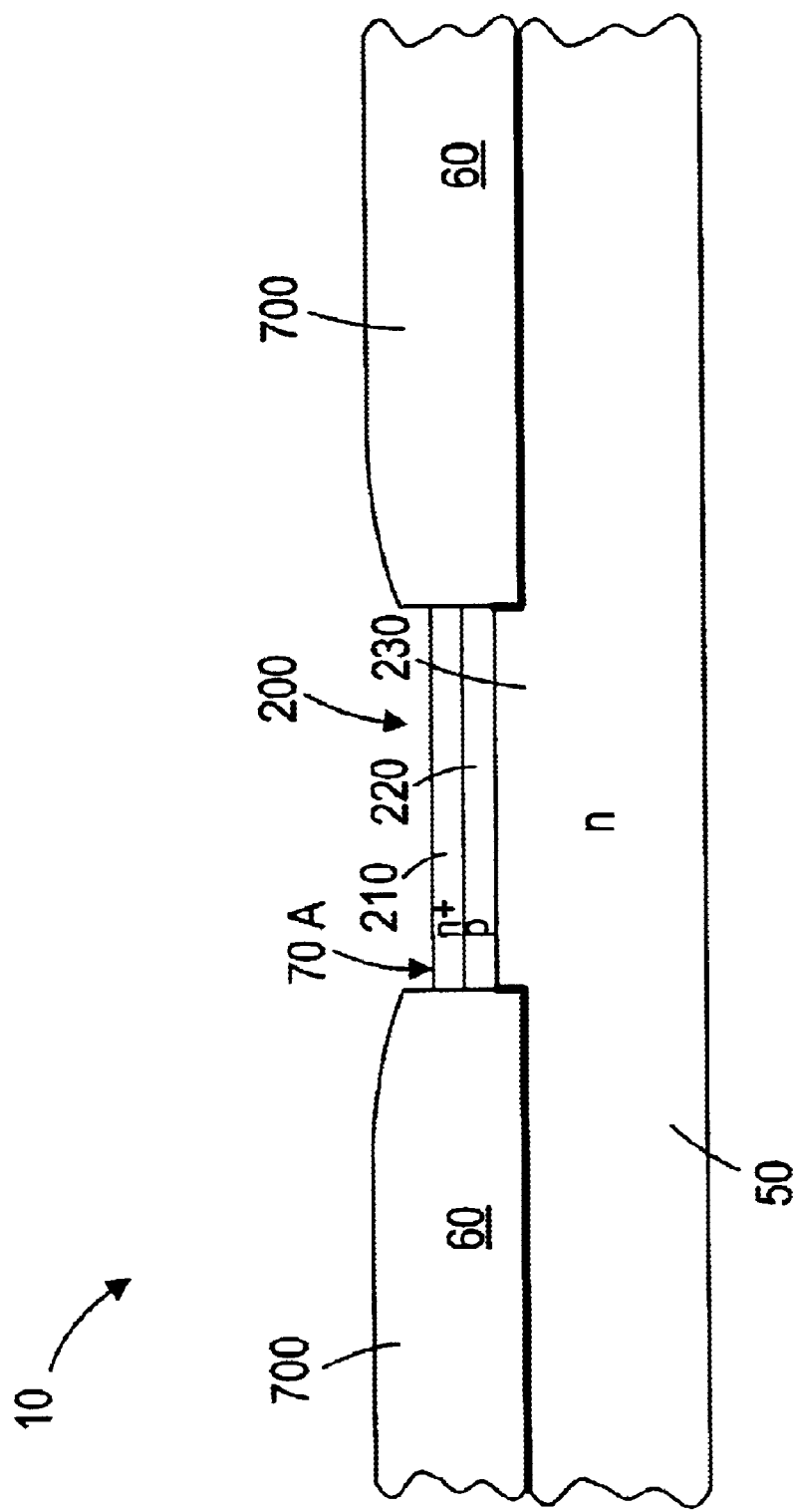
FIG. 10 shows a simple field walled emitter bipolar device fabricated in one active device region of FIG. 9.

FIG. 10 shows a simple field walled emitter bipolar structure 200 fabricated in larger active device island region 70A. N-doped substrate 50 forms collector 230. P-doped base 220 is formed by a first implant of p-type dopants into substrate 50, while n-doped emitter 210 is formed by a second implant or out-diffusion from poly emitter source of n-type dopants. Field oxide 700 separates bipolar structure 200 from other devices on substrate 50.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for processing a semiconductor substrate, said method comprising:

providing a trench isolation structure, said structure including a multi-layer film stack on a plurality of device regions of said substrate, said device regions separated from one another by one or more trenches, where each of said one or more trenches is substantially filled with an oxide;

performing a first polish, said first polish comprising polishing said oxide to a level of a first polish stop layer of said multi-film stack; and performing a second polish, said second polish comprising polishing said oxide to a level of a second polish stop layer of said multi-film stack.

2. The method of claim 1, wherein providing a trench isolation structure includes depositing said multi-film stack on said substrate.

3. The method of claim 2, wherein providing a trench isolation structure further includes etching said trenches through said multi-film stack and into corresponding underlying portions of said substrate.

4. The method of claim 3, wherein providing a trench isolation structure further includes substantially filling said trenches with said oxide.

5. The method of claim 1, wherein said multi-layer film stack further includes a first oxide layer and a second oxide layer, said first oxide layer disposed between said first polish stop layer and said second polish stop layer, and said second oxide layer disposed between said second polish stop layer and said substrate.

6. The method of claim 5, further comprising removing said first oxide layer subsequent to performing said first polish step.

7. The method of claim 1, wherein said first and second polish stop layers comprise nitride layers.

8. The method of claim 1, further comprising removing said first polish stop layer subsequent to performing said first polish.

9. The method of claim 1, further comprising removing said second polish stop layer subsequent to performing said second polish.

10. A method for processing a semiconductor substrate, said method comprising:

providing a multi-layer film stack comprising a second oxide layer disposed above said substrate, a second nitride layer disposed above said second oxide layer, a first oxide layer disposed above said second nitride layer, and a first nitride layer disposed above said first oxide layer, said multi-layer film stack disposed on first and second device regions of said substrate, wherein said first and second device regions are separated by one or more trenches;

depositing a trench oxide that both fills said one or more trenches and covers said first nitride layer; and polishing said trench oxide.

11. The method of claim 10, wherein polishing said trench oxide comprises a first polish, said first polish comprising polishing said trench oxide to expose said first nitride layer.

12. The method of claim 11, wherein polishing said trench oxide further comprises a second polish, said second polish comprising polishing said trench oxide to expose said second nitride layer.

13. The method of claim 10, further comprising removing said first nitride layer.

14. The method of claim 10, further comprising removing said first oxide layer.

15. The method of claim 10, further comprising removing said second nitride layer.

16. The method of claim 10, wherein a thickness of said first nitride layer is between about 1000 and about 2500 angstroms.

17. The method of claim 16, wherein the thickness of said first nitride layer is about 2000 angstroms.

18. The method of claim 10, wherein said first nitride layer is deposited using a PECVD method.

19. The method of claim 10, wherein a thickness of said first oxide layer is between about 100 and about 400 angstroms.

20. The method of claim 19, wherein the thickness of said first oxide layer is about 200 angstroms.

21. The method of claim 10, wherein a thickness of said second nitride layer is between about 300 and about 700 angstroms.

22. The method of claim 21, wherein the thickness of said second nitride layer is about 500 angstroms.

23. The method of claim 10, wherein said second nitride layer is formed using a PECVD method.

24. The method of claim 10, wherein said first device region is larger than said second device region.

25. The method of claim 10, wherein subsequent to polishing said trench oxide, a first device height difference equal to a height difference between a top of said trench oxide at a first edge of said first device region and a top of said second oxide layer at said first edge of said first device region is approximately equal to a second device height difference, said second device height difference equal to a height difference between a top of said trench oxide at a first edge of said second device region and a top of said second oxide layer at said first edge of said second device region.

26. The method of claim 25, wherein said first device height difference and said second device height difference are approximately equal to a thickness of said second nitride layer.

27. The method of claim 25, wherein said first device region is larger than said second device region.

28. The method of claim 10, further comprising growing a passivation oxidation layer prior to depositing said trench oxide.

29. A method for processing a semiconductor substrate, said method comprising:
    depositing a second oxide layer over said substrate;
    depositing a second nitride layer over said second oxide layer;
    depositing a first oxide layer over said second nitride layer;
    depositing a first nitride layer over said first oxide layer, said first and second oxide layers and first and second nitride layers comprising a multi-layer film stack;
    etching through the first nitride layer, the first oxide layer, the second nitride layer, and the second oxide layer of said multi-layer film stack and corresponding underlying portions of said substrate to form at least two trenches; and
    depositing an oxide that both fills said at least two trenches and covers said first nitride layer.

30. The method of claim 29, further comprising polishing said oxide to expose said first nitride layer.

31. The method of claim 30, wherein said polishing includes chemical mechanical polishing using a slurry.

32. The method of claim 31, wherein said slurry includes cerium.

33. The method of claim 30, further comprising removing said first nitride layer.

34. The method of claim 33, wherein said first nitride layer is removed using a hot phosphoric acid etch.

35. The method of claim 33, further comprising removing said first oxide layer.

36. The method of claim 35, wherein said first oxide layer is removed by reactive ion etching.

37. The method of claim 35, further comprising polishing said oxide to expose said second nitride layer.

38. The method of claim 37, wherein said polishing includes chemical mechanical polishing using a slurry.

39. The method of claim 38, wherein said slurry includes cerium.

40. The method of claim 37, further comprising removing said second nitride layer.

41. The method of claim 40, wherein said second nitride layer is removed using a hot phosphoric acid etch.

42. The method of claim 29, further comprising growing a passivation oxidation layer prior to depositing said oxide to fill said trenches and cover said first nitride layer.

* * * * *